United States Patent
Laskaris

(10) Patent No.: US 6,570,476 B1
(45) Date of Patent: May 27, 2003

(54) THERMAL SHIELD SUSPENSION FOR SUPERCONDUCTIVE MAGNETS

(75) Inventor: Evangelos Trifon Laskaris, Schenectady, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 10/064,472

(22) Filed: Jul. 17, 2002

(51) Int. Cl.[7] .............................. F25B 19/00; H01F 7/22
(52) U.S. Cl. ..................... 335/216; 324/319; 62/51.1
(58) Field of Search .......................... 335/216; 324/318, 324/319, 320; 62/51.1

(56) References Cited

U.S. PATENT DOCUMENTS

| | | | | |
|---|---|---|---|---|
| 4,496,073 A | * | 1/1985 | Silver et al. | 220/560.11 |
| 4,595,899 A | * | 6/1986 | Smith et al. | 324/320 |
| 4,721,934 A | * | 1/1988 | Stacy | 174/15.4 |
| 4,878,351 A | * | 11/1989 | Weber et al. | 62/297 |
| 4,878,352 A | * | 11/1989 | Weber et al. | 62/51.1 |
| 5,140,823 A | * | 8/1992 | Mraz | 62/45.1 |
| 5,446,433 A | * | 8/1995 | Laskaris et al. | 335/216 |
| 6,011,454 A | * | 1/2000 | Huang et al. | 220/901 |
| 6,043,729 A | * | 3/2000 | Laskaris et al. | 324/318 |
| 6,358,582 B1 | * | 3/2002 | Nagendra et al. | 335/216 |
| 6,358,583 B1 | * | 3/2002 | Nagendra et al. | 335/216 |

* cited by examiner

Primary Examiner—Ramon M. Barrera
(74) Attorney, Agent, or Firm—Armstrong Teasdale LLP

(57) ABSTRACT

A method for assembling a thermal shield suspension assembly including a plurality of straps, wherein the straps are arranged in an alternately cross hatch arrangement such that a plurality of first straps extend at a first orientation with regards to the cryogenic vessel and a plurality of second straps extend at a second orientation with regards to the cryogenic vessel, and wherein the first orientation is different from the second orientation and each second strap is disposed between the adjacent first strap is provided, the method comprising securing the first strap including the tensioning block to a thermal shield flange and a cryogenic vessel flange and securing the second strap to the thermal shield flange and the cryogenic vessel flange.

25 Claims, 5 Drawing Sheets

THERMAL SHIELD SUSPENSION FOR SUPERCONDUCTIVE MAGNETS

BACKGROUND OF INVENTION

This invention relates generally to superconductive magnets and more particularly, to thermal shield suspensions for use in superconductive magnets.

Superconductive magnets include superconductive coils which generate uniform and high strength magnetic fields, such as are employed in magnetic resonance imaging (MRI) systems for medical diagnostics. Within at least some known magnets, the superconductive coil assemblies are enclosed in a thermal shield surrounded by a vacuum enclosure. Various designs of tube suspension systems are employed to support the superconductive coil assembly such that the magnet is maintained a pre-determined distance from both the thermal shield and the vacuum enclosure.

The suspension systems include a plurality of straps and bolts rigidly connected together to support the superconductive coil assembly and the associated components, i.e. the thermal shield and vacuum enclosure. The suspension systems are subjected to stresses from supporting the weight of the components and during operation, such systems may also be subjected to thermal stresses induced between components. Additionally, vibrational stresses may also be induced into the suspension system during operation. Overtime, continued operation with such stresses may cause premature failure.

To facilitate preventing such failures, at least some known suspension systems include extensive damping systems to minimize the effects of the stresses. However such damping systems are expensive and increase the overall cost of manufacture.

SUMMARY OF INVENTION

In one aspect a method for assembling a thermal shield suspension assembly including a plurality of straps, wherein the straps are arranged in an alternately cross hatch arrangement such that a plurality of first straps extend at a first orientation with regards to the cryogenic vessel and a plurality of second straps extend at a second orientation with regards to the cryogenic vessel, and wherein the first orientation is different from the second orientation and each second strap is disposed between the adjacent first strap is provided, the method comprising securing the first strap including the tensioning block to a thermal shield flange and a cryogenic vessel flange and securing the second strap to the thermal shield flange and the cryogenic vessel flange.

In another aspect a superconductive magnet is provided that includes a superconductive coil assembly including a cryogenic vessel, wherein the cryogenic vessel includes at least a flange, a thermal shield enclosing the coil assembly, wherein the thermal shield includes at least one flange, a vacuum enclosure enclosing the thermal shield, and a thermal shield suspension assembly positioned between the cryogenic vessel and the thermal shield. The thermal shield suspension assembly includes a plurality of straps configured to facilitate damping vibrational forces induced to the magnet. The straps are arranged in an alternately cross hatch arrangement such that a plurality of first straps extend at a first orientation with regards to the cryogenic vessel and a plurality of second straps extend at a second orientation with regards to the cryogenic vessel, wherein the first orientation is different from the second orientation and each second strap is disposed between the adjacent first strap.

In a further aspect a thermal shield suspension assembly for a superconductive magnet is provided, the assembly includes a superconductive coil assembly including a cryogenic vessel, wherein the cryogenic vessel includes at least a flange, a thermal shield enclosing the coil assembly, wherein the thermal shield includes at least one flange, and a plurality of straps. The straps are positioned between the cryogenic vessel and the thermal shield and configured to dampen vibrational and hyper-sonic sound responses induced in the magnet, the straps are arranged in an alternately cross hatch arrangement such that a plurality of first straps extend at a first orientation with regards to the cryogenic vessel and a plurality of second straps extend at a second orientation with regards to the cryogenic vessel, wherein the first orientation is different from the second orientation and each second strap is disposed between the adjacent first strap.

In yet another aspect, a plurality of thermal shield suspension straps are provided, wherein the straps are arranged in an alternately cross hatch arrangement. A first strap includes a first end, a second end, and a unitary elongate body extending therebetween, the first end includes a tensioning block, and the first strap extends at a first orientation with regards to a cryogenic vessel. A second strap includes a first end, a second end, and a unitary elongate body extending therebetween, and the second strap extends at a second orientation with regards to the cryogenic vessel, wherein the first orientation is different from the second orientation and each second strap is disposed between the adjacent first strap.

DETAILED DESCRIPTION

Figure 1:
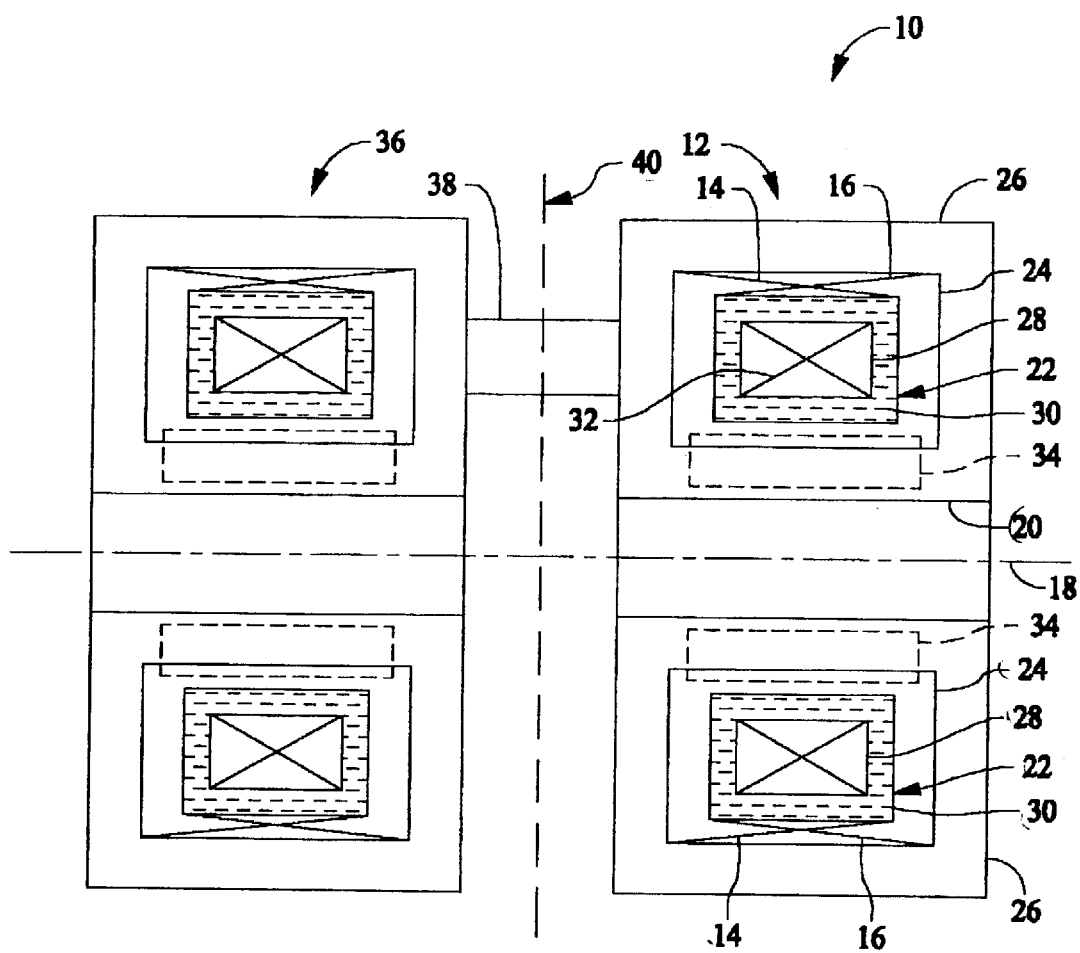
FIG. 1 is a schematic side view of an open magnet including the thermal shield suspension straps.

FIG. 1 is a schematic side view of an open magnet 10. Magnet 10 includes a first assembly 12 which includes a plurality of first and second thermal shield suspension straps 14 and 16, respectively. In one embodiment, magnet 10 is a superconductive magnet. First assembly 12 has a centrally-located longitudinal axis 18 and defines a bore 20 therein.

First assembly 12 includes a superconductive coil assembly 22 at a cryogenic temperature, a thermal shield 24 that encloses coil assembly 22, and a vacuum enclosure 26 at an ambient temperature and enclosing thermal shield 24. Coil assembly 22 includes a cryogenic vessel 28 containing cryogenic fluid 30 and superconductive coils 32. In the exemplary embodiment, cryogenic vessel 28, thermal shield 24 and vacuum enclosure 26 are substantially toroidal-shaped and radially spaced from one another with reference to axis 18. Furthermore, in the exemplary embodiment, cryogenic vessel 28, thermal shield 24 and vacuum enclosure 26 are coaxially aligned with axis 18 such that thermal shield 24 is positioned between, and spaced apart from cryogenic vessel 28 and vacuum enclosure 26. In another embodiment, thermal shield 24 is formed from aluminum. In one embodiment, vacuum enclosure 26 and cryogenic vessel 28 are formed from non-magnetic stainless steel or aluminum.

First assembly 12 also includes a tube suspension assembly 34 including a plurality of tubes (not shown) extending between cryogenic vessel 28, thermal shield 24, and vacuum enclosure 26. Tube suspension assembly 34 is under tension and mechanically supports components within the vacuum enclosure 26 against magnetic forces generated by magnet 10.

In one embodiment, magnet 10 includes a second assembly 36 that is connected to first assembly 12 by a support member 38. More specifically, support member 38 extends longitudinally between first assembly 12 and second assembly 36. Second assembly 36 is a mirror image of first assembly 12 with respect to a plane 40 positioned longitudinally and equi-distant between first assembly 12 and second assembly 36. Plane 40 is substantially perpendicular to axis 18. In one embodiment, support member 38 is a nonmagnetizable support member consisting of non-magnetic stainless steel.

Figure 2:
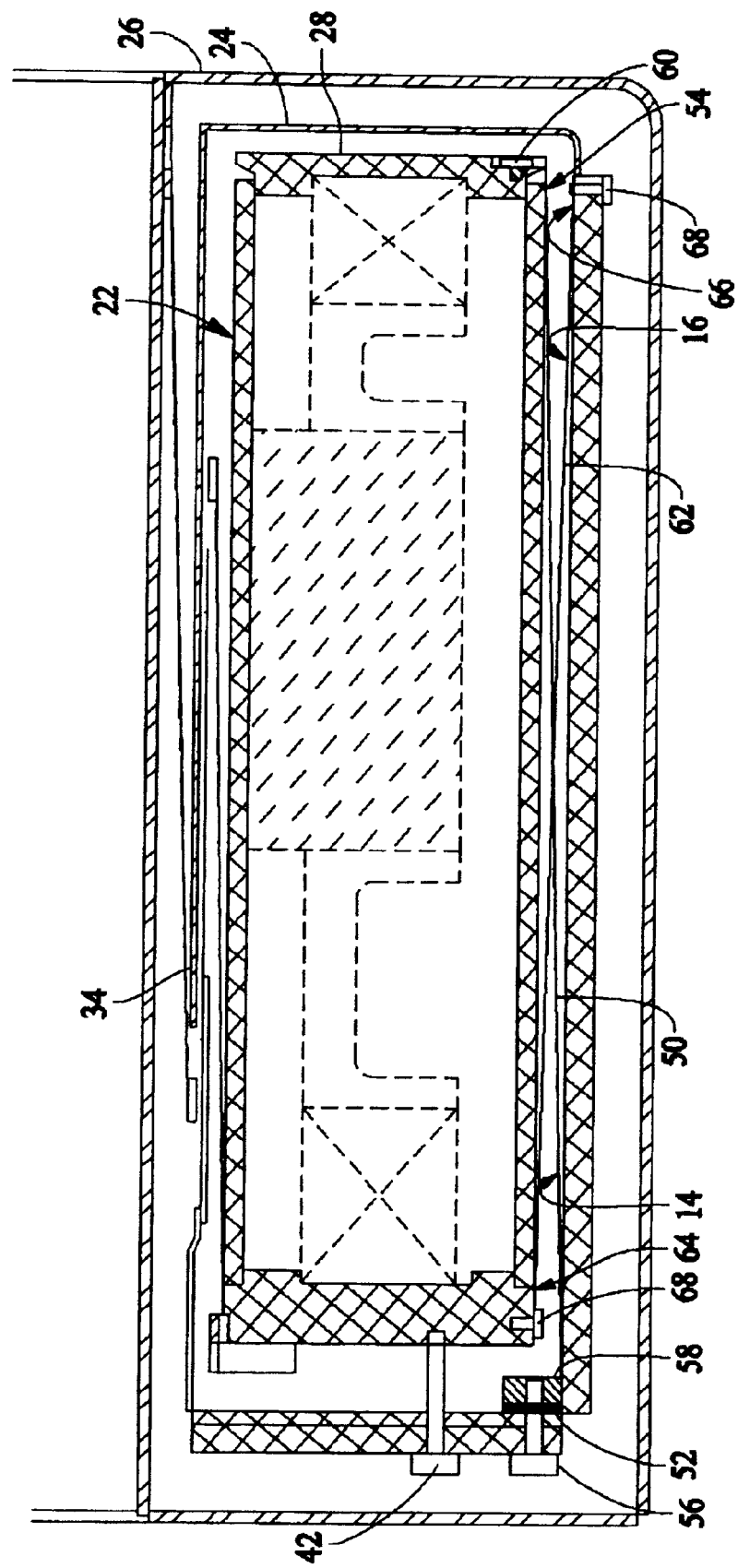
FIG. 2 is a schematic fragmentary view of a portion of the magnet in FIG. 1 including the thermal shield suspension straps.

FIG. 2 is a schematic fragmentary view of a portion of magnet 10 including a first thermal shield strap 14 and a second thermal shield strap 16. Straps 14 and 16 are both positioned within thermal shield 24 to interconnect thermal shield 24 and cryogenic vessel 28. Although only one first thermal shield strap 14 and only one second thermal shield strap 16 are shown, a plurality of thermal shield straps 14 and 16, described in more detail below, are substantially coaxially and equally spaced circumferentially about axis 18. In one embodiment, each magnet assembly 10 includes eight pairs of straps 14 and 16; In another embodiment, thermal shield straps 14 and 16 are spaced about two inches apart. Thermal shield 24 and cryogenic vessel 28 are variably spaced apart by a jacking bolt 42.

First thermal strap 14 has an elongate body 50 including a first strap end 52 and a second strap end 54. First strap end 52 is secured to thermal shield 24 by a fastener 56 and a tensioning block 58. Second strap end 54 is secured to cryogenic vessel 28 by a fastener 60. Fasteners 56 and 60 are described in more detail below.

Second thermal shield strap 16 has an elongate body 62 including a first strap end 64 and a second strap end 66. First end 64 is secured to cryogenic vessel 28 by a fastener 68. Second end 66 is secured to thermal shield 24 by fastener 68.

Figure 3:
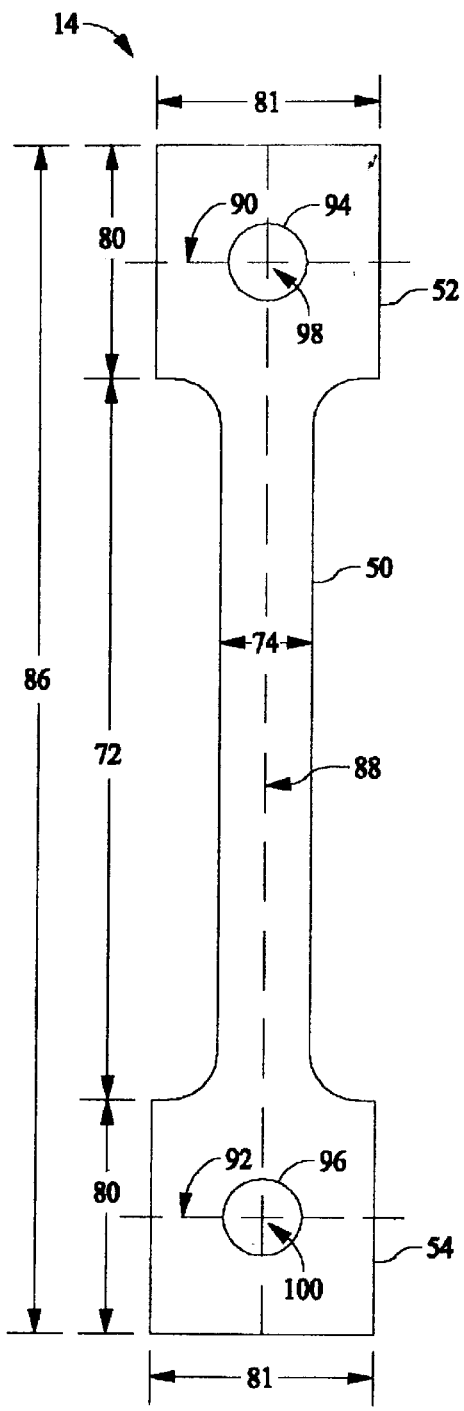
FIG. 3 is a plan view of a first thermal shield suspension strap.
Figure 4:
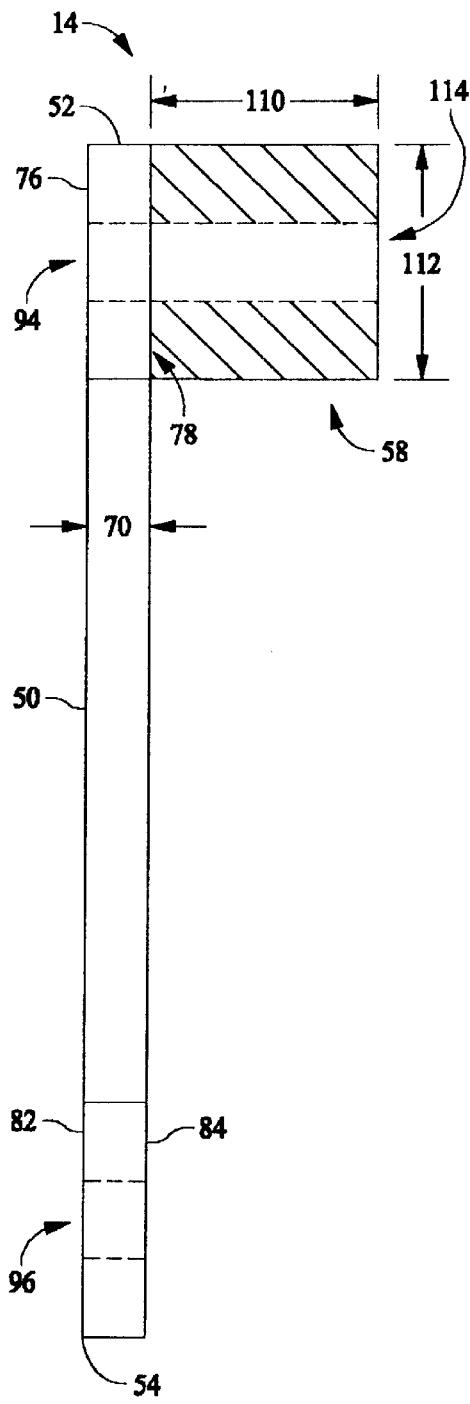
FIG. 4 is side view of first thermal suspension strap.

FIG. 3 is a plan view of a thermal shield suspension strap 14. FIG. 4 is a side view of thermal shield suspension strap 14 including elongate body 50, first end 52, and second end 54. Strap 14 is unitary, rigid, and substantially flat. Accordingly, body 50, first end 52, and second end 54 are substantially co-planar. In one embodiment, strap 14 is fabricated from Inconel® 718 which is commercially available from Special Materials, Huntington, W.Va. Alternatively, strap 14 is fabricated from a metallic material such as, but not limited to, titanium or stainless-steel.

In the exemplary embodiment, elongate body 50 is substantially rectangular in shape and includes a thickness 70, a length 72, and a width 74. In one embodiment, thickness 70 is approximately 0.040 inches, length 72 is approximately 23.50 inches, and width 74 is approximately 0.3125 inches. Thickness 70 is substantially uniform throughout body 50 along length 72. First end 52 is substantially square and includes a top surface 76 and an opposite bottom surface 78. First end 52 has a length 80 and a width 81. In one embodiment, length 80 and width 81 are each approximately 0.75 inches. Second end 54 is also substantially square and includes a top surface 82 and bottom surface 84. Second end 54 also has length 80 and width 81. Strap 14 has a length 86 measured between first and second ends 52 and 54, respectively. In one embodiment, length 86 is approximately 25.00 inches.

Elongate body 50 also includes an axis of symmetry 88 extending from first end 52 to second end 54. First end 52 includes an axis of symmetry 90 that is perpendicular to axis 88, and second end 54 includes an axis of symmetry 92 that is perpendicular to axis 88. A first aperture 94 is disposed within first end 52 and a second aperture 96 is disposed within second end 54. Each aperture 94 and 96 include a center 98 and 100 respectively. Centers 98 and 100 are each positioned along axis 88. In one embodiment, aperture 94 has a diameter of approximately 0.375 inches, and aperture 96 has a diameter of approximately 0.25 inches.

Tensioning block 58 is secured to first end bottom surface 78. In one embodiment, tensioning block 58 is welded to surface 78. Tensioning block 58 is substantially cubicle and includes a thickness 110, a length 112, and a width (not shown). In one embodiment, thickness 110 is approximately 0.50 inches, and length 112, and the width are each approximately 0.75 inches. A block aperture 114 is disposed within tensioning block 58 and concentrically aligned with respect to first end aperture 94 and axis 88. Block aperture 114 is threaded and sized to receive fastener 56 therein. In one embodiment, block aperture 114 has a diameter of approximately 0.375 inches.

Figure 5:
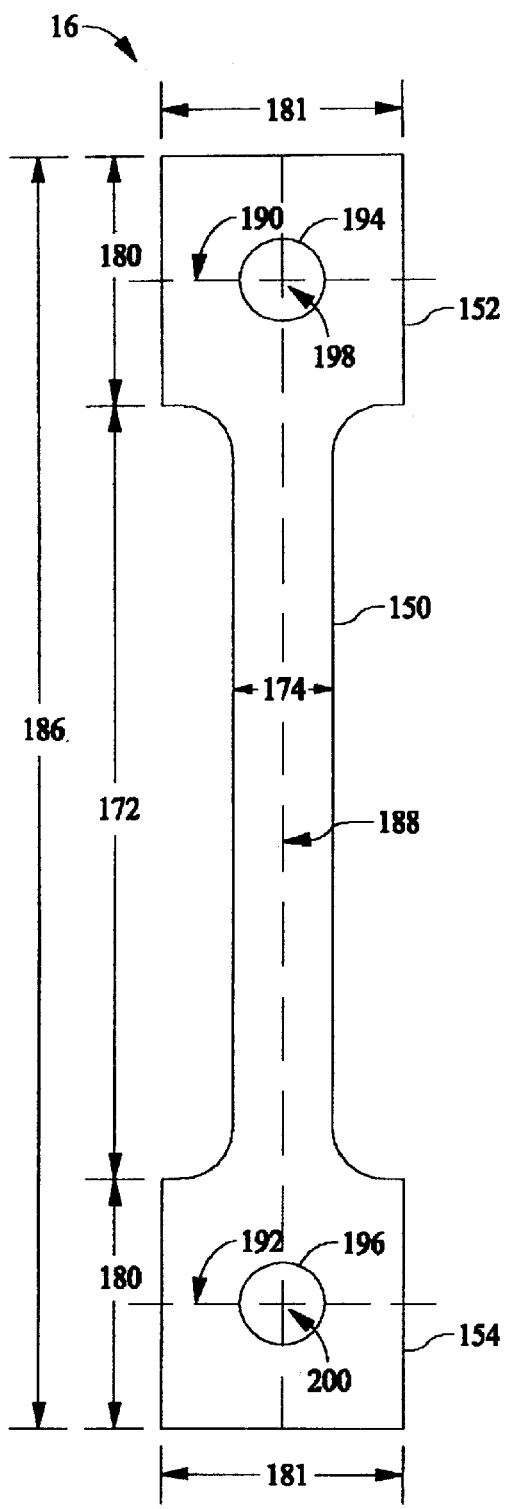
FIG. 5 is a plan view of a second thermal shield suspension strap.
Figure 6:
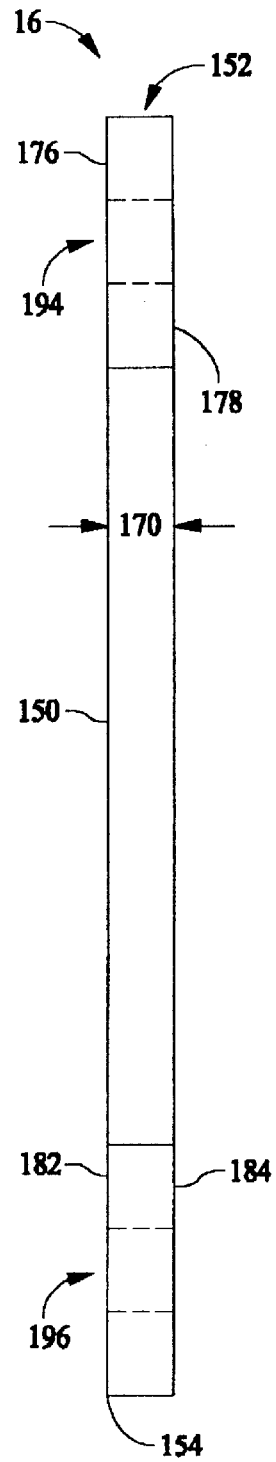
FIG. 6 is a side view of second thermal shield suspension strap.

FIG. 5 is a plan view of a thermal shield suspension strap 16 and FIG. 6 is a side view of thermal shield suspension strap 16 including elongate body 150, first end 152, and second end 154. Strap 16 is unitary, rigid, and substantially flat. Accordingly, body 150, first end 152, and second end 154 are substantially co-planar. In one embodiment, strap 16 is fabricated from Inconel® 718 which is commercially available from Special Materials, Huntington, W.Va. Alternatively, strap 16 is fabricated from a metallic material, such as, but not limited to, titanium or stainless-steel.

Elongate body 150 is substantially rectangular in shape and includes a thickness 170, a length 172, and a width 174. In one embodiment, thickness 170 is approximately 0.040 inches, length 172 is approximately 21.50 inches, and width 174 is approximately 0.3125 inches. First end 152 is substantially square and includes a top surface 176 and an opposite bottom surface 178. First end 152 has a length 180 and a width 181. In one embodiment, length 180 and width 181 are approximately 0.75 inches. Second end 154 is also substantially square and includes a top surface 182 and bottom surface 184. Second end 154 also has length 180 and width 181. Strap 16 has a length 186 measured between first and second ends 152 and 154, respectively. In one embodiment, length 186 is approximately 23.00 inches.

Elongate body 150 also includes an axis of symmetry 188 extending from first end 152 to second end 154. First end 152 includes an axis of symmetry 190 that is perpendicular to axis 188, and second end 154 includes an axis of symmetry 192 that is perpendicular to axis 188. A first aperture 194 is disposed within first end 152 and a second aperture 196 is disposed within second end 154. Each aperture 194 and 196 include a center 198 and a center 200.

Centers 198 and 200 are each positioned along axis 188. In one embodiment, aperture 194 has a diameter of approximately 0.375 inches, and aperture 196 has a diameter of approximately 0.25 inches.

Figure 7:
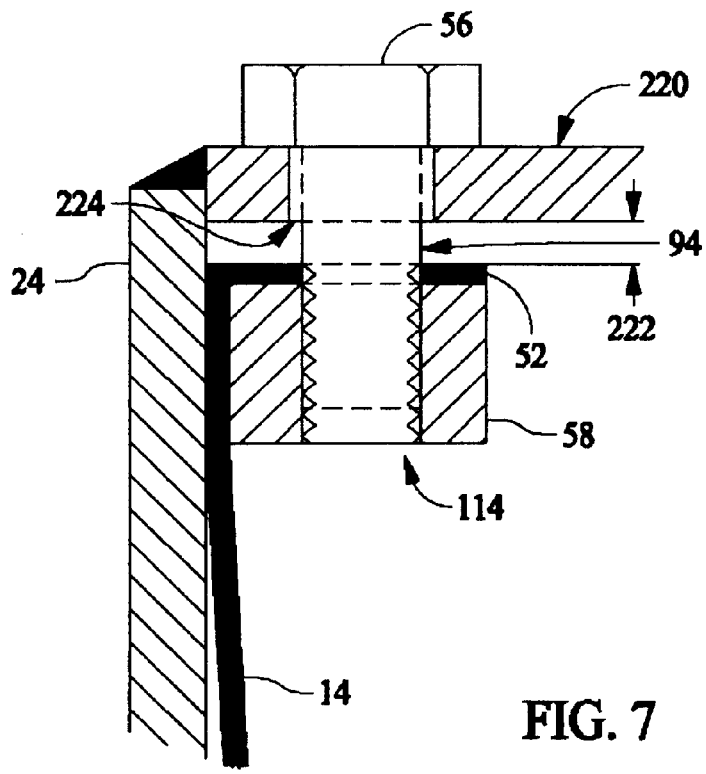
FIG. 7 is an enlarged cross-sectional view of a first thermal shield fastener.

FIG. 7 is an enlarged cross-sectional view of thermal shield fastener 56 including tensioning block 58, thermal shield 24, and first thermal suspension strap 14. Strap 14 is secured to a thermal shield flange 220 by fastener 56 and block 58 such that a gap 222 is defined between strap 14 and shield flange 220. Fastener 56 is inserted through thermal shield aperture 224 and strap aperture 94 into threaded tension block aperture 114.

Figure 8:
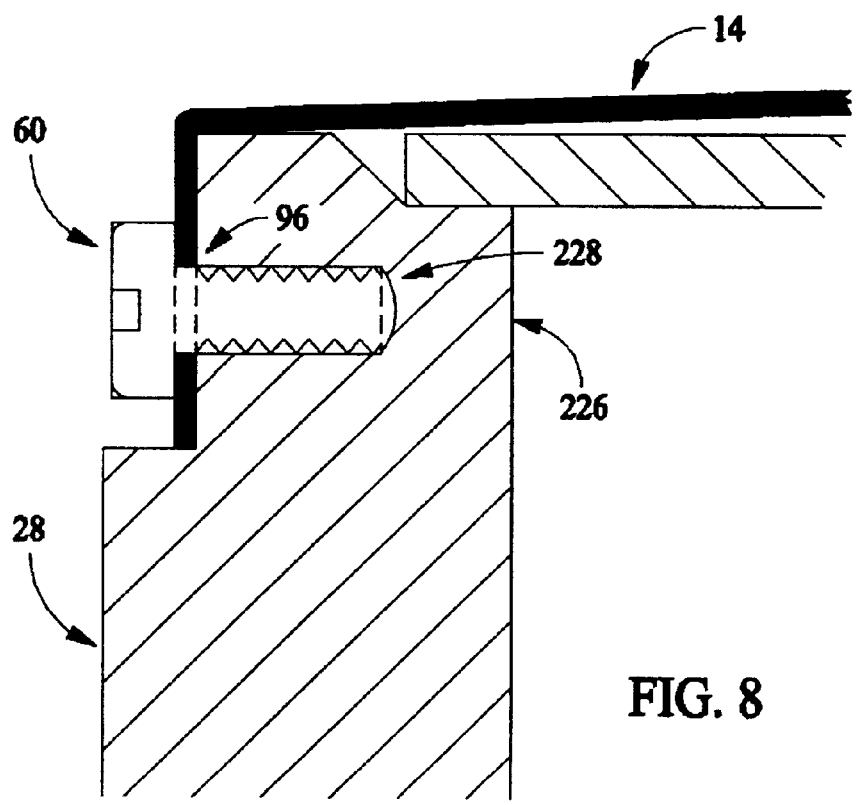
FIG. 8 is an enlarged cross-sectional view of a second thermal shield fastener.

FIG. 8 is an enlarged cross-sectional view of thermal shield fastener 60 including cryogenic vessel 28, and first thermal suspension strap 14. Strap 14 is secured to a cryogenic vessel flange 226 by fastener 60. Fastener is inserted through strap aperture 96 into a threaded aperture 228 in cryogenic vessel 28.

During assembly, second thermal suspension strap 16 is installed with thermal shield 24 deformed by approximately 0.0625 inches. Thermal shield 24 is deformed by adjusting jacking bolt 42. First strap 14 is installed with gap 220 set at approximately 0.125 inches. Then jacking bolt 42 is removed and straps 14 and 16 are tensioned by tightening fastener 56 to reduce gap 220 to zero. Once the straps are tensioned, the 0.0625 inch deformation of thermal shield 24 is removed.

Securing the ends of the thermal shield suspension straps 14 and 16 is accomplished by forming a rounded rim in the ends of the straps, some of such ends being attached to thermal shield 24 and cryogenic vessel 28, as appropriate and as can be appreciated by an artisan. It is noted that straps 14 and 16 are under tension and provide a superior system for mechanically supporting the magnet components within the vacuum enclosure thermal shield 24 against the magnetic forces generated by magnet 10, as can be understood by those skilled in the art.

While the invention has been described in terms of various specific embodiments, those skilled in the art will recognize that the invention can be practiced with modification within the spirit and scope of the claims.

What is claimed is:

1. A method for assembling a thermal shield suspension assembly comprising a plurality of straps, said straps arranged in an alternately cross hatch arrangement such that a plurality of first straps extend at a first orientation with regards to the cryogenic vessel and a plurality of second straps extend at a second orientation with regards to the cryogenic vessel, wherein said first orientation is different from said second orientation and each said second strap is disposed between adjacent first strap, said method comprising: securing said first strap including a tensioning block to a thermal shield flange and a cryogenic vessel flange; and securing said second strap to said thermal shield flange and said cryogenic vessel flange.

2. A method for assembling a thermal shield suspension assembly in accordance with claim 1 wherein said first strap further comprises a first end, a second end, and a unitary elongate body extending therebetween, the first end includes a tensioning block, and the second strap including a first end, a second end, and a unitary elongate body extending therebetween.

3. A method for assembling a thermal shield suspension assembly in accordance with claim 1 wherein said first strap first end and second end, and said tensioning block each include at least one aperture and said second strap first end and second end each include at least one aperture, said securing the first strap further comprises welding said tensioning block to said first strap first end such that said tensioning block aperture is aligned with said first end aperture.

4. A method for assembling a thermal shield suspension assembly in accordance with claim 1 wherein said thermal shield flange includes at least two apertures and said cryogenic vessel includes at least two apertures, securing said first strap further comprises aligning said first strap first end aperture with said thermal shield flange aperture and said first strap second end aperture with said cryogenic vessel flange aperture and aligning said second strap first end aperture with said cryogenic vessel flange aperture and said second strap second end aperture with said thermal shield flange aperture.

5. A method for assembling a thermal shield suspension assembly in accordance with claim 1 wherein said thermal shield assembly includes a plurality of fasteners and at least one jacking bolt, said securing said first and second straps further comprises deforming said thermal shield by inserting and tightening said jacking bolt, tensioning said first and second straps by inserting and tightening said fasteners, and removing jacking bolt after tensioning said first and second straps.

6. A superconductive magnet comprising:
a superconductive coil assembly comprising a cryogenic vessel comprising at least a flange;
a thermal shield enclosing said coil assembly, said thermal shield comprising at least one flange;
a vacuum enclosure enclosing said thermal shield; and
a thermal shield suspension assembly positioned between said cryogenic vessel and said thermal shield, said thermal shield suspension assembly comprising a plurality of straps configured to facilitate damping vibrational forces induced to said magnet, said straps arranged in an alternately cross hatch arrangement such that a plurality of first straps extend at a first orientation with regards to the cryogenic vessel and a plurality of second straps extend at a second orientation with regards to the cryogenic vessel, wherein said first orientation is different from said second orientation and each said second strap is disposed between adjacent first strap.

7. A magnet in accordance with claim 6 further comprising a tube suspension assembly extend between said cryogenic vessel and said thermal shield, said tube assembly also extending between said thermal shield and said vacuum enclosure.

8. A magnet in accordance with claim 7 wherein said tube suspension assembly comprises a plurality of axially overlapped tubes, said tube suspension assembly interconnected with said cryogenic vessel, said thermal shield, and said vacuum enclosure.

9. A magnet in accordance with claim 6 wherein said plurality of straps extend between said cryogenic vessel and said thermal shield.

10. A magnet in accordance with claim 6 wherein said plurality of straps extend between said cryogenic vessel and said thermal shield, at least one of said plurality of straps mounted to said thermal shield flange, and at least one of said plurality of straps mounted to said cryogenic vessel flange.

11. A magnet in accordance with claim 6 wherein said plurality of straps comprise eight pairs of straps.

12. A magnet in accordance with claim 6 wherein each said first and second straps each comprise a first end, a second end, and a body extending therebetween, said first and second ends for coupling to said cryogenic vessel flange and said thermal shield flange.

13. A magnet in accordance with claim 6 wherein said plurality of straps are substantially equi-spaced circumferentially around said thermal shield.

14. A magnet in accordance with claim 6 wherein said thermal shield suspension assembly further configured to induce a pre-load to said thermal shield.

15. A thermal shield suspension assembly for a superconductive magnet, said assembly comprising:
   a superconductive coil assembly comprising a cryogenic vessel comprising at least a flange;
   a thermal shield enclosing said cryogenic vessel, said thermal shield comprising at least a flange; and
   a plurality of straps said straps positioned between said cryogenic vessel and said thermal shield and configured to facilitate damping vibrational forces and hyper-sonic sound responses induced in said magnet, said straps arranged in an alternately cross hatch arrangement such that a plurality of first straps extend at a first orientation with regards to the cryogenic vessel and a plurality of second straps extend at a second orientation with regards to the cryogenic vessel, wherein said first orientation is different from said second orientation and each said second strap is disposed between adjacent first strap.

16. An assembly in accordance with claim 15 wherein said plurality of straps comprises eight pairs of straps.

17. An assembly in accordance with claim 15 wherein at least one of each said plurality of straps is mounted to each said thermal shield flange and cryogenic vessel flange.

18. An assembly in accordance with claim 15 wherein each said first and second straps each comprise a first end, a second end, and a body extending therebetween, said first and second ends for coupling to said cryogenic vessel flange and said thermal shield flange.

19. An assembly in accordance with claim 15 wherein said plurality of straps are substantially equi-spaced circumferentially around said thermal shield.

20. An assembly in accordance with claim 15 wherein said thermal shield suspension assembly further comprises a means for applying a pre-load to said thermal shield.

21. A plurality of thermal shield suspension straps, said straps arranged in an alternately cross hatch arrangement and comprising:
   a first strap comprising a first end, a second end, and a unitary elongate body extending therebetween, said first end includes a tensioning block, said first strap extends at a first orientation with regards to a cryogenic vessel; and
   a second strap comprising a first end, a second end, and a unitary elongate body extending therebetween, said second strap extends at a second orientation with regards to the cryogenic vessel, wherein said first orientation is different from said second orientation and each said second strap is disposed between adjacent first strap.

22. A thermal shield suspension strap in accordance with claim 21 wherein said strap is rigid, substantially flat, and comprises a uniform thickness.

23. A thermal shield suspension strap in accordance with claim 21 wherein said body is substantially rectangular and said first and second ends are substantially square.

24. A thermal shield suspension strap in accordance with claim 21 wherein said first end, said second end, and said tensioning block each comprise at least one aperture.

25. A thermal shield suspension strap in accordance with claim 24 wherein said each said tensioning block is attached to each first strap end by at least a weld such that said tensioning block aperture is aligned with said first end aperture.

* * * * *